United States Patent [19]

Fujimura et al.

[11] Patent Number: 4,524,306
[45] Date of Patent: Jun. 18, 1985

[54] EXTRA-HIGH PRESSURE MERCURY DISCHARGE LAMP

[75] Inventors: Takashi Fujimura; Masahiro Nishizawa, both of Mobara, Japan

[73] Assignee: Hitachi, Ltd., Tokyo, Japan

[21] Appl. No.: 376,124

[22] Filed: May 7, 1982

[30] Foreign Application Priority Data

May 13, 1981 [JP] Japan .................................. 56-70703

[51] Int. Cl.³ ............................................ H01J 11/04
[52] U.S. Cl. ..................................... 315/326; 315/276; 315/357; 313/620; 313/631; 313/639
[58] Field of Search .............. 313/16, 232, 150, 151, 313/204, 631, 639, 620; 315/291, 108, 326, 327, 357, 276, 326

[56] References Cited

U.S. PATENT DOCUMENTS

| | | | |
|---|---|---|---|
| 997,882 | 0/1911 | Weintraub | 313/150 |
| 1,064,686 | 6/1913 | Hewitt | 315/326 |
| 1,091,563 | 3/1914 | Dempster | 315/150 |
| 1,116,480 | 0/1914 | Podszus | 313/612 |
| 1,188,578 | 6/1916 | Thomas | 313/611 |
| 1,656,898 | 1/1928 | Belleaud et al. | 313/150 |
| 1,900,138 | 3/1933 | Torrisi | 313/16 |
| 2,198,513 | 4/1940 | Knoop | 313/612 |
| 2,329,124 | 9/1943 | Lemmers | 315/326 |
| 2,329,125 | 9/1943 | Lemmers | 315/326 |

*Primary Examiner*—Harold Dixon
*Attorney, Agent, or Firm*—Antonelli, Terry & Wands

[57] ABSTRACT

An extra-high pressure mercury discharge lamp comprising an end-sealed glass tube shaped to provide a long arc type tube, mercury contained in the both ends respectively of the glass tube, a pair of electrodes provided in the both ends respectively of the glass tube, each of the electrodes including one end portion extending toward the exterior from the associated end of the glass tube, an intermediate portion immersed in the mercury, and the other end portion extending toward the interior beyond the surface of the mercury facing toward the middle of the glass tube, and a power source connected between the externally extending portions of the electrode pair to supply power thereacross, the other or internally extending portions of the electrode pair having a length so selected that the mercury discharge lamp emits light of a sharp emission profile suitable for the exposure of a very fine pattern.

5 Claims, 16 Drawing Figures

F I G. 10
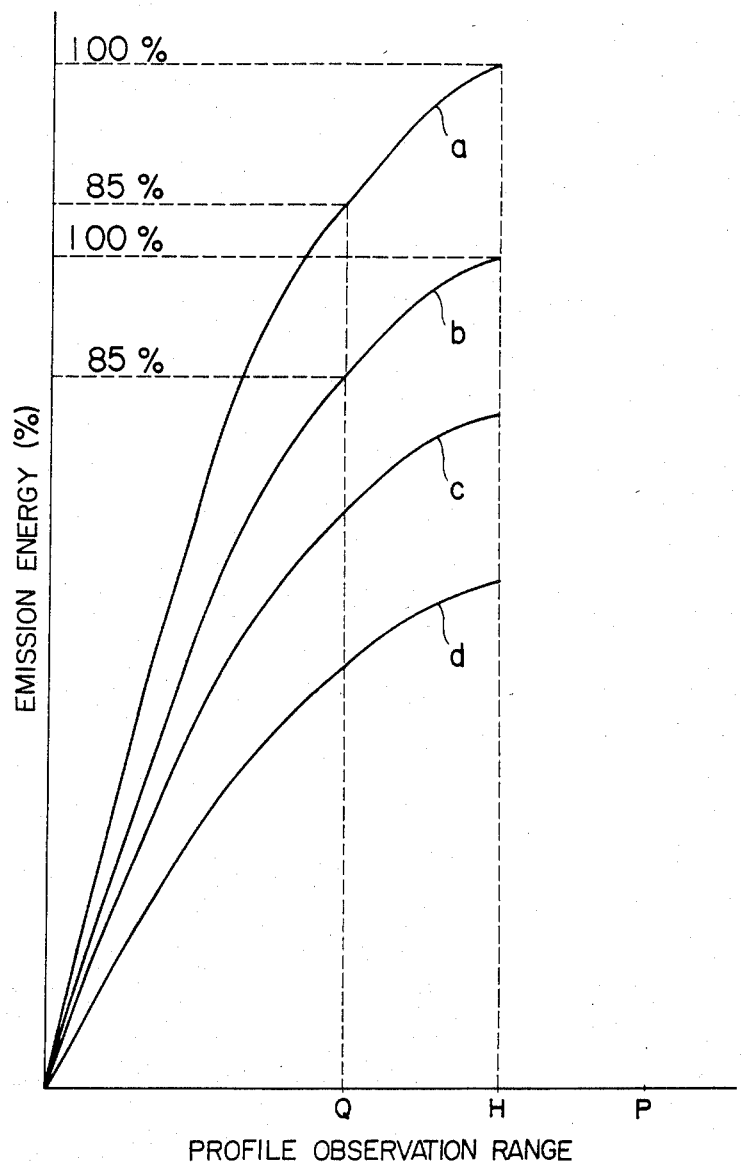

EXTRA-HIGH PRESSURE MERCURY DISCHARGE LAMP

FIELD OF THE INVENTION

This invention relates to an extra-high pressure mercury discharge lamp of long arc type suitable for use as a light source for the exposure of very fine patterns.

BRIEF DESCRIPTION OF THE DRAWINGS

FIG. 10 is a graph showing the relative percentages of the emitted light energy included in a plurality of internal regions concentric with the tube axis of the mercury discharge lamp.

DESCRIPTION OF THE PRIOR ART

Various light sources were utilized in the past for the exposure of patterns, and those used for this purpose included an extra-high pressure mercury discharge lamp of short arc type emitting light directly toward the object, or a so-called point light source provided by an extra-high pressure mercury discharge lamp of short arc type using a condensing mirror, an integrating sphere, a condensing lens or the like for condensing light emitted from such an extra-high pressure mercury discharge lamp, or by an extra-high pressure mercury discharge lamp of long arc type with which similar condensing means is combined to condense light emitted from the lamp into light analogous to that emitted from a point light source.

Recently, however, a light source capable of meeting the tendency toward more linearization and higher density of exposed patterns has been demanded, and an exposure light source in the form of an assembly of point light sources has been developed and put into practical use. For instance, an extra-high pressure mercury discharge lamp of long arc type is now utilized as a linear light source used for the exposure of a stripe-type shadow mask of a color picture tube or as a curved linear light source used in a projection mask aligner used for the exposure of an LSI of high integration density, especially, a 2.5 $\mu$m rule process pattern.

Figure 1:
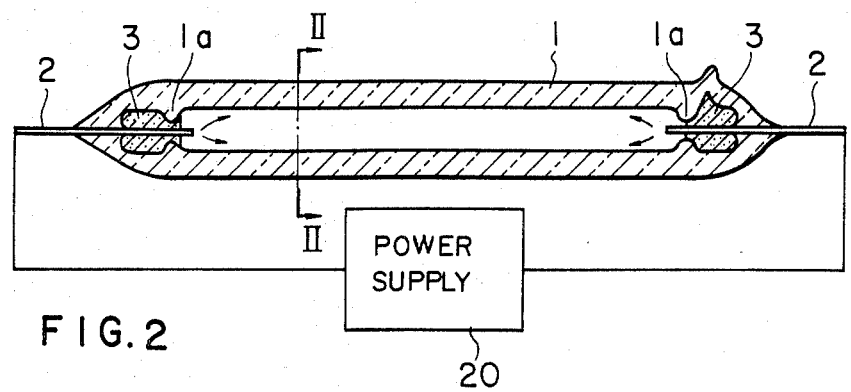
FIG. 1 is a longitudinal sectional view of an extra-high pressure mercury discharge lamp of long arc type.

FIG. 1 is a longitudinal sectional view of such an extra-high pressure mercury discharge lamp of long arc type (which will be referred to hereinafter merely as a mercury discharge lamp). Referring to FIG. 1, the mercury discharge lamp includes a glass tube 1 which is a hollow tubular envelope of quartz glass, a pair of electrodes 2 in the form of tungsten rods sealed in the both ends respectively of the glass tube 1, and mercury 3 enclosed or contained in the both ends respectively of the glass tube 1. In each end of the glass tube 1, a cavity is formed by a circumferentially extending ridge 1a, and the mercury 3 is contained in this cavity with part of the associated electrode 2 being immersed in the mercury 3. The inner end of each electrode 2 extends into the hollow space of the glass tube 1 beyond the ridge 1a, and the amount of mercury 3 is so selected that the end of the electrode 2 projects a predetermined length from the mercury 3.

When a voltage from a power source 20 is applied across the electrodes 2, electrons are emitted from the opposed ends of the electrodes 2 to collide against mercury atoms floating in the hollow space of the glass tube 1, and ionization and excitation are repeated to start discharge. In the course of transition from a steady state, in which the energy of the mercury atoms is Em, to a steady state in which the energy of the mercury atoms is reduced to En (En<Em) by being stimulated by the electrons, the energy difference (Em−En) is discharged in the form of light energy h$\nu$, and the relation Em−En=h$\nu$ holds in this case. Light emitted as a result of the discharge has a spectrum, since the oscillation frequency of light emitted during the transition between such two steady states of energy differs depending on the energy level.

Figure 2:
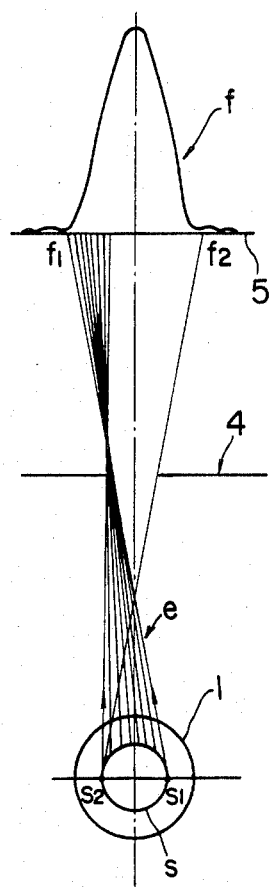
FIG. 2 is a projection diagram illustrating the manner of light projection in an exposure apparatus using the mercury discharge lamp shown in FIG. 1.

Light emitted in the glass tube 1 as a result of the energy transition spreads almost uniformly in all the directions over the entire hollow space of the glass tube 1. However, when light emitted from the plasma arc acting as the light source s in the glass tube 1 is shielded by a mask 4 having a slit of predetermined dimensions as shown in FIG. 2 so that light can pass through only the space limited by the slit, its optical path depicts a locus e as shown, and light from the area defined between the points $s_1$ and $s_2$ of the light source s is projected between points $f_1$ and $f_2$ on an image forming plane 5 thereby forming an illuminance profile as shown. FIG. 2 is a sectional view taken along the line II—II in FIG. 1.

Such a mercury discharge lamp, when used as a light source for the exposure of a pattern, has not been fully satisfactory in that the plasma arc spreads widely in the radial direction of the glass tube, resulting in difficulty of attainment of satisfactory resolution of the exposed pattern and giving rise to fluctuation or degradation of the dimensional accuracy during the step of pattern transfer. Especially, such a mercury discharge lamp has not necessarily been suitable as a light source used for the exposure of very fine patterns.

Figure 3:
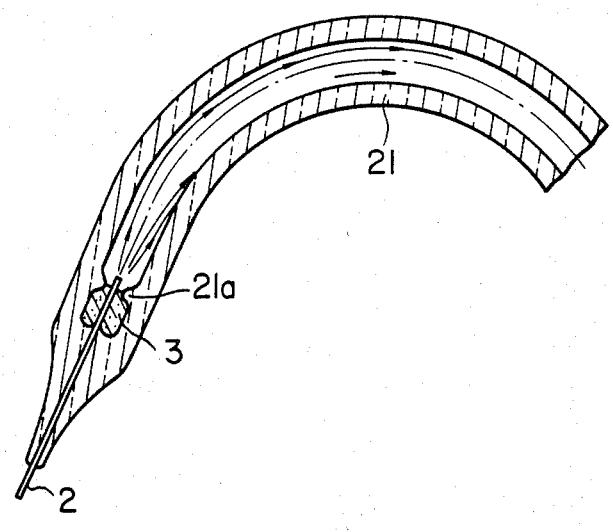
FIG. 3 is a longitudinal sectional view of part of an extra-high pressure mercury discharge lamp of long arc type having a curved shape.

FIG. 3 is a longitudinal sectional view of part of an extra-high pressure mercury discharge lamp of long arc type used hitherto as a linear light source used in, for example, a projection mask aligner as described hereinbefore. Its glass tube 21 is formed into a uniformly curved shape so that the aberration in the optical lens system between the light source and the mask pattern and that in the optical lens system between the mask pattern and the exposure plane can be minimized. A ridge 21a shown in FIG. 3 corresponds to the ridge 1a shown in FIG. 1.

In such a mercury discharge lamp, electrons emitted from the electrodes 2 collide against mercury atoms to cause discharge of light energy $h\nu$. The electrons advancing straightforward are absorbed to disappear by colliding against the inner wall of the curved glass tube, and those passing through the radially central area of the glass tube can only continuously flow. This is because there is a temperature gradient between the temperature of mercury vapor in the vicinity of the tube inner wall and that at the center of the plasma arc formed in the radially central area of the glass tube. Thus, the temperature of mercury vapor in the glass tube is not uniform, and the temperature of mercury vapor at the center of the plasma arc is as high as about 5,000° C. to 6,000° C., whereas that in the vicinity of the tube wall is only as high as about 100° C. to 200° C.

Figure 4:
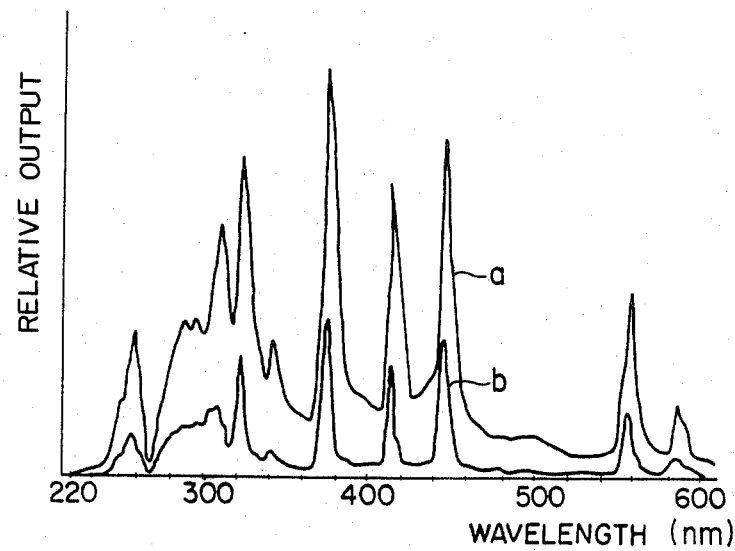
FIG. 4 shows the spectrum of light emitted from a mercury discharge lamp.

FIG. 4 shows the spectrum of light emitted from such a mercury discharge lamp. The spectral intensity is proportional to the vapor pressure of mercury. In FIG. 4, a represents the spectrum of light emitted from the radially central area of the glass tube, and b represents that from the area close to the tube inner wall, and it can be seen that there is a great difference between the mercury vapor pressures in these areas.

Such a mercury discharge lamp has also been accompanied by the problem of insufficiency of the resolution of a very fine pattern when it is used for the exposure of such a pattern, as pointed out hereinbefore.

SUMMARY OF THE INVENTION

With a view to solve the aforementioned problem or obviate the aforementioned difficulty, it is a primary object of the present invention to provide an extra-high pressure mercury discharge lamp of long arc type which can be used with high accuracy for the exposure of a very fine pattern in spite of a conventional or known structure.

The present invention which attains the above object is featured by the fact that the lamp current is set at a predetermined value so as to emit light of narrow and sharp profile.

DESCRIPTION OF THE PREFERRED EMBODIMENTS

It is commonly known that, when the image of the plasma arc produced in an extra-high pressure mercury discharge lamp of long arc type is used as a light source for the exposure of a very fine pattern, the sharpness of the light source image (which will be referred to hereinafter as an emission profile) affects directly the resolution of the very fine pattern obtained by exposure of a mask pattern, hence, the dimensions and the dimensional accuracy of the exposed pattern.

Figure 5:
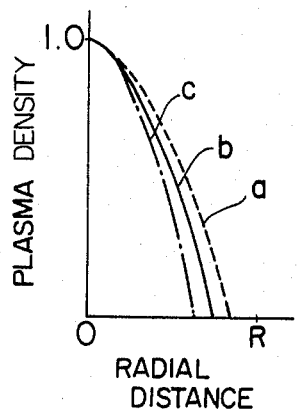
FIG. 5 shows the plasma density distribution in a mercury discharge lamp.

The inventors conducted research and studies on the relation between the value of the lamp current in such a mercury discharge lamp and the shape of the emission profile. FIG. 5 shows the plasma density distribution in the glass tube of the mercury discharge lamp. In FIG. 5, the horizontal axis represents the radial distance measured from the central axis of the glass tube, and the vertical axis represents the plasma density. The symbols O and R in FIG. 5 indicate the position of the tube axis and the position of the inner wall of the glass tube respectively. The plasma density distribution in the glass tube differs depending on the value of lamp current. The curves a, b and c indicate the plasma density distribution at the lamp current of 1.6 A, 1.4 A and 1.2 A respectively. It will be seen in FIG. 5 that the larger the lamp current value, the plasma region tends to extend more toward the tube inner wall, and the smaller the lamp current value, the plasma region tends to concentrate more around the tube axis.

Figure 6:
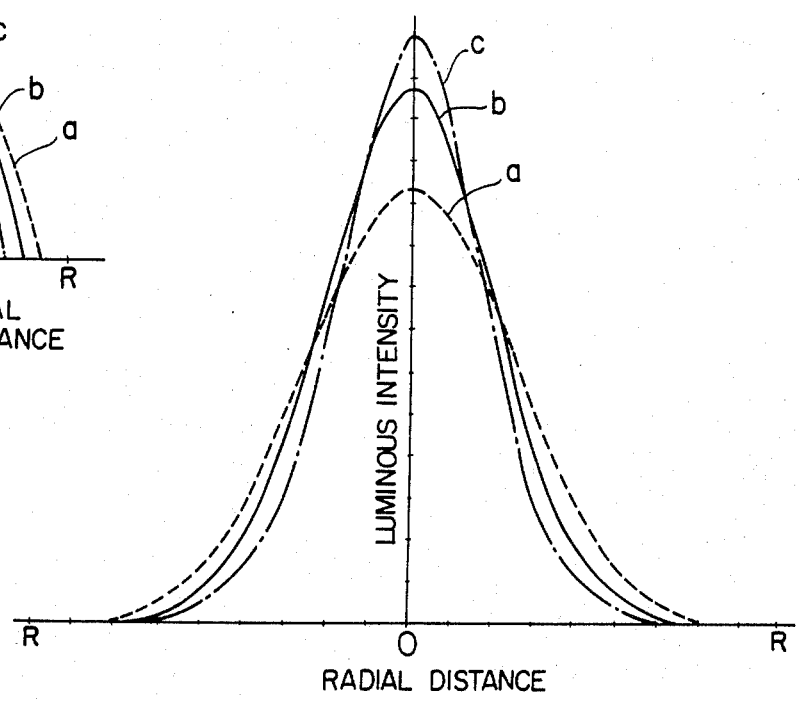
FIG. 6 shows the profiles of light emitted at the plasma densities shown in FIG. 5.

FIG. 6 shows the emission profiles at the individual plasma densities shown in FIG. 5. The curves a, b and c in FIG. 6 represent the profiles at the lamp current of 1.6 A, 1.4 A and 1.2 A respectively, when the same amount of power is supplied to the mercury discharge lamp. The wavelength of light ranges from about 300 nm to 500 nm. It will be seen in FIG. 6 that, in the case of the curve a obtained with the largest lamp current value of 1.6 A, the plasma arc extends toward the tube inner wall in the radial direction of the glass tube as shown by the curve a in FIG. 5. Thus, in this case, the peak of light intensity is low although the emission profile has a wide bottom. In contrast, in the case of the curve c obtained with the smallest lamp current value of 1.2 A, the plasma arc is limited to the area around the tube axis as shown by the curve c in FIG. 5, and the shape of the emission profile is sharper than the curve a, since the emission profile has a narrow bottom and the peak of light intensity is higher.

Therefore, the shape of the emission profile can be determined by suitably setting the value of lamp current supplied to the mercury discharge lamp. This lamp current value can be set according to the factors including the length of the electrode portion projecting from the mercury (referred to hereinafter as a projection length), the cooling water temperature cooling the tube outer wall, the mercury vapor pressure determined by the distance between the electrodes and the voltage applied across the electrodes, and the inner and outer diameters of the glass tube.

Although the lamp current can be adjusted by adjusting one or more of: (1) the projection length of the electrodes; (2) the diameter of the electrodes; (3) the amount of mercury charged in the glass tube; and (4) the wall thickness of the glass tube, it is the electrode projection length which can be most easily changed in the process of manufacture of the mercury discharge lamp. That is, by adjusting the seal-off position of a mercury charging tube 30 (FIG. 11) in the step of tipping off the glass tube, the amount of mercury advancing into within the glass tube from the cavity can be adjusted, and, therefore, the projection length of the electrodes can be easily adjusted. For example, the electrode projection length is set at 1 mm to 3 mm, and the lamp current is set at 1.2 A to 1.6 A when the outer and inner diameters of the glass tube are 6 mm and 2 mm respectively, the distance between the electrodes is 45 mm to 55 mm, the voltage applied during the on-state of the lamp is 1,000 V to 2,000 V, and the cooling water temperature is 20° C. to 30° C. Therefore, any one of emission profiles as shown in FIG. 6 can be obtained as desired by suitably adjusting the electrode projection length in the step of tipping off the glass tube.

The emission profiles corresponding to the lamp current values of 1.6 A and 1.4 A in FIG. 6 are not sharp enough when compared with that corresponding to the lamp current value of 1.2 A. However, the inventors have confirmed that such emission profiles could also provide a light source desired for the exposure of a very fine pattern under the lamp operating conditions including the physical dimensions, applied voltage and cooling water temperature specified above.

Figure 7:
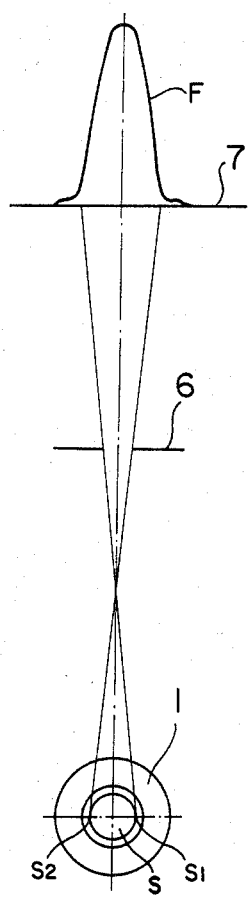
FIG. 7 is a projection diagram illustrating the manner of light projection in an exposure apparatus using an embodiment of the extra-high pressure mercury discharge lamp of long arc type according to the present invention.

FIG. 7 is a projection diagram illustrating the manner of light projection in a color picture tube exposure apparatus using the above-described mercury discharge lamp for exposure. Light emitted from the light source s (the plasma arc) in the glass tube 1 of the mercury discharge lamp is directed through a slit of a shadow mask 6 onto a photosensitive coating 7 coated on the inner surface of the panel of the color picture tube. The illuminance profile on the photosensitive coating 7 has a sharp shape as shown by F in FIG. 7. Therefore, the resolution of the exposed pattern formed on the photosensitive coating 7 by the exposure through the shadow mask 6 can be improved, so that undesirable fluctuation or degradation of the dimensional accuracy can be minimized.

Figure 8:
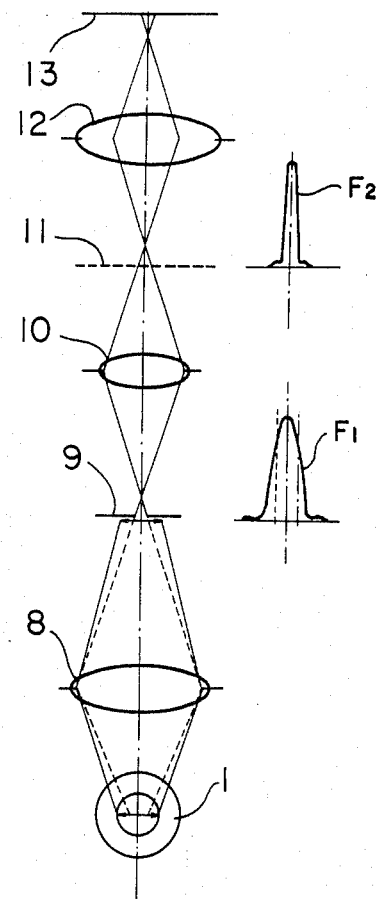
FIG. 8 is a projection diagram illustrating similarly the manner of light projection in a projection mask aligner using the extra-high pressure mercury discharge lamp of long arc type according to the present invention.

FIG. 8 is a projection diagram illustrating the manner of light projection in a projection mask aligner using the mercury discharge lamp. Light emitted from the light source (the plasma arc) in the glass tube 1 of the mercury discharge lamp is focused by a first lens 8 on a first image forming plane 9 to form an illuminance profile as shown by $F_1$. In order that the depth of focus and the aberration of lenses in the post stage of the optical path can be limited to within a certain range, a field stop extracts a limited portion only of the illuminance profile $F_1$, and the central arc image thereof is focused by a second lens 10 on a second image forming plane 11. The illuminance profile on this second image forming plane 11 is as shown by $F_2$. The image of the illuminance profile $F_2$ is forced by a third lens 12 on a third image forming plane 13. Therefore, when a mask is placed on the second image forming plane 11 and a photosensitive coating or surface is disposed on the third image forming plane 13, the mask pattern can be transferred on the photosensitive surface. The sharper the illuminance profile $F_1$, the illuminance profile $F_2$ is also sharper, thereby improving the resolution of the transferred pattern (the exposed pattern) and making possible the exposure of a very fine pattern.

Figure 9:
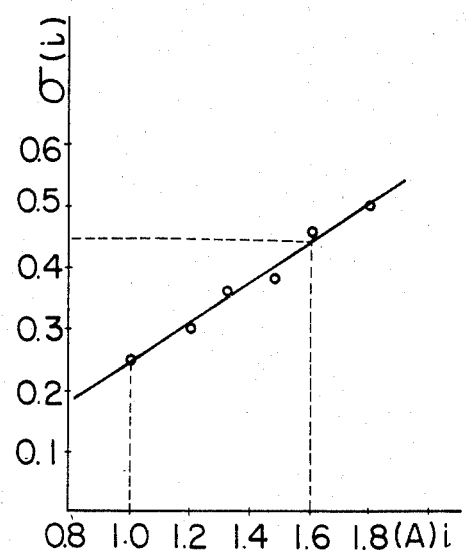
FIG. 9A is a graph showing the relation between the value of variance and the value of lamp current when the luminous intensity is expressed as a distribution function analogous to the normal distribution function.
FIG. 9B is a graph showing the relative values of luminous intensities for various values of variance.
FIG. 9C is a graph showing the relation between the value of variance and the resolution of an exposed pattern.
FIG. 9D is a graph showing the relation between the value of lamp current and the rupture rate of the mercury discharge lamp.
Figure 9:
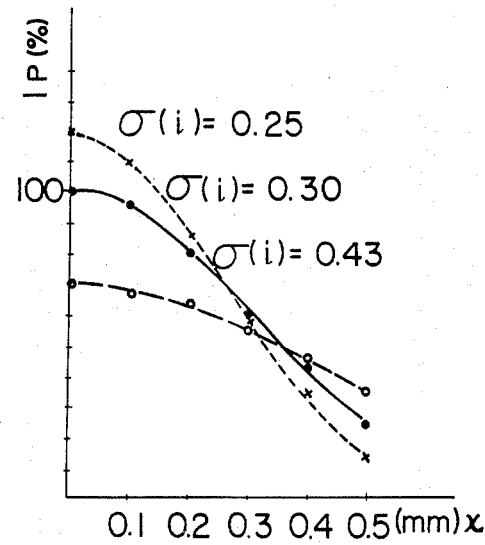
Figure 9:
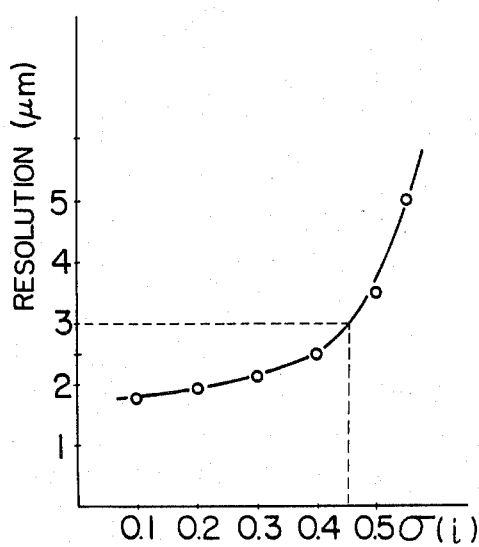
Figure 9:
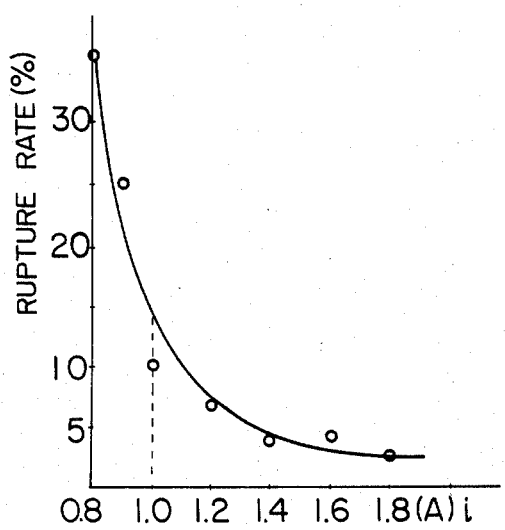

The sharpness of the emission profile will now be quantitatively analyzed. In order to numerically explain how the shape of the emission profile shown in FIG. 6 changes depending on the value of lamp current, a mercury discharge lamp of long arc type having an outer diameter of 6 mm, an inner diameter of 2 mm and an electrode spacing of 45 mm was manufactured by way of experiment. In the experiment, the shape of the emission profile of light from the mercury discharge lamp was observed while supplying a lamp current ranging from 1.0 A to 1.8 A and applying a lamp voltage ranging from 1,000 V to 2,000 V. The cooling water temperature was 20° C. to 30° C. As a result of the experiment, the shape of the emission profile was expressed as $$Ip(x) = W \cdot \eta \cdot \frac{1}{\sqrt{2} \, \sigma(i)} \cdot e^{-\frac{x^2}{2 \cdot \sigma(i)^2}} \quad (1)$$

where $Ip(x)$ is the intensity of light (luminous intensity) at a distance x from the tube axis, W is the input power, and $\eta$ is the luminous efficacy. It was thus proved that the luminous intensity can be expressed by the numerical value analogous to that given by the known normal distribution function, and the value of variance is closely related to the value of lamp current. That is, it was proved that the value of lamp current i and the value of variance $\sigma(i)$ has a relation as shown in FIG. 9A. It will be seen in FIG. 9A that the smaller the value of lamp current i, the value of variance $\sigma(i)$ is also smaller, and the value of $\sigma(i)$ is about 0.25 to 0.5 within the lamp current range of 1.0 A to 1.8 A, the shape of the emission profile changing with the value of $\sigma(i)$. FIG. 9B shows the relative values of $Ip(x)$ when the value of $\sigma(i)$ is 0.25, 0.30 and 0.43 respectively.

FIG. 9C shows the results of exposure of a 2.5 μm rule process pattern (the pattern resolution less than 3 μm) with the shape of the emission profile given by the equation (1). It will be understood from FIG. 9C that the resolution becomes abruptly low at a larger value of $\sigma(i)$ than $\sigma(i) = 0.45$ corresponding to the lamp current value of 1.6 A, and the mercury discharge lamp is no more suitable as the pattern exposure light source.

On the other hand, for the determination of suitability of the mercury discharge lamp as the pattern exposure light source, it is also necessary to take into account the useful service life of the mercury discharge lamp, besides the resolution of the exposed pattern. FIG. 9D shows the relation between the value of lamp current i and the rate of rupture of the mercury discharge lamp within 48 hours after turned on. The rupture rate of more than 20% is undesirable in that the exposure apparatus cannot stably operate and continuous maintenance is required since one light source among five must always be replaced. It will be seen from FIG. 9D that the lamp current level is desirably higher than 1.0 A from the viewpoint of the useful service life of the mercury discharge lamp. Therefore, in order that the mercury discharge lamp can operate with a sufficiently high resolution and a sufficiently long service life when used as a light source for the exposure of a very fine pattern, it is preferable that the value of $\sigma(i)$ given by the equation (1) is not larger than 0.45 and not smaller than 0.25, hence, the value of lamp current lies within the range of 1.0 A and 1.6 A.

The ranges of the lamp current i and variance $\sigma(i)$ for providing a preferred emission profile are $1.0 \leq i \leq 1.6$ and $0.25 \leq \sigma(i) \leq 0.45$ respectively in the embodiment of the present invention. However, these ranges are not always generally applicable since the preferred values of i and $\sigma(i)$ differ depending on the inner diameter of the glass tube and the distance between the electrodes. For the purpose of more definitely defining the shape of the emission profile, the inventors have clarified what percentage of the total energy of emitted light is concentrated in the region of one-half the inner diameter of the glass tube. The energy $En(x)$ of emission concentrated in the region of 2x measured from the tube axis (the profile observation range) is expressed as a function of x and Ip(x) as follows:

$$En(x) = 2 \cdot \int_0^x Ip(x)dx = W \cdot \eta \cdot (1 - e^{-k(i)x}) \quad (2)$$

where k(i) is the damping coefficient determined by the value of lamp current. FIG. 10 shows the relative percentage curves of emission energy when the lamp current is 1.2 A. The vertical axis of FIG. 10 represents the emission energy included in the region of 2x from the tube axis, that is, in the profile observation range, and the horizontal axis represents the profile observation range. Since the emission profile is observed on a plane orthogonal with respect to the tube axis, 2x represents also the range on such a plane. The point P on the horizontal axis indicates the observation range equal to the tube inner diameter, and, at this point P, therefore, 2x=D, where D is the inner diameter of the glass tube. The point Q indicates the observation range equal to ½ of the tube inner diameter, and, at this point Q, therefore, 2x=D/2. The point H indicates the end of the bottom of the emission profile. Therefore, the percentage of the emission energy at this point H is 100%. In FIG. 10, the curves a, b, c and d represent the characteristic curves obtained with the input power of 1.8 kW, 1.6 kW, 1.4 kW and 1.2 kW respectively. It will be seen from FIG. 10 that the percentage of the emission energy included in the region of D/2 around the tube axis at the lamp current of 1.2 A is 85% of the total emission energy.

The following table shows the relative percentages of the emission energy included in the region of D/2 around the tube axis at various lamp current values respectively.

| Lamp current value | Relative percentage of emission energy |
|---|---|
| 1.6 A | 68% |
| 1.4 | 76.5 |
| 1.2 | 85 |
| 1.0 | 93.5 |

The inventors have confirmed that the mercury discharge lamp can operate with excellent operating characteristics required for a light source used for the exposure of a very fine pattern when it can emit light of such a sharp emission profile that the percentage of the emission energy included in the region of D/2 (D: the inner diameter of the glass tube) is at least 68% of the total emission energy. Thus, a mercury discharge lamp can be preferably used as a light source for the exposure of a very fine pattern when the mercury discharge lamp can emit light of emission profile such that the percentage of the emission energy included in the region of D/2 (D: the inner diameter of the tube) is at least 68% of the total emission energy.

The inventors have further confirmed that, when the value of lamp current is decreased while maintaining the same input power level, the output of the peak of the emission spectrum decreases, but the outputs of other wavelengths increase. Therefore, the energy of light supplied to the photosensitive material coated on the photosensitive surface or screen increases.

As is commonly experienced, the tip portions of the electrodes in the glass tube are gradually consumed after use of the mercury discharge lamp over a long time, and it becomes difficult to maintain the lamp current at the predetermined value thereby to maintain the percentage of the energy of emitted light at the value of more than 68%. It is therefore necessary to maintain the lamp current at the predetermined value.

A method for maintaining the lamp current at the predetermined value will now be described.

Figure 11:
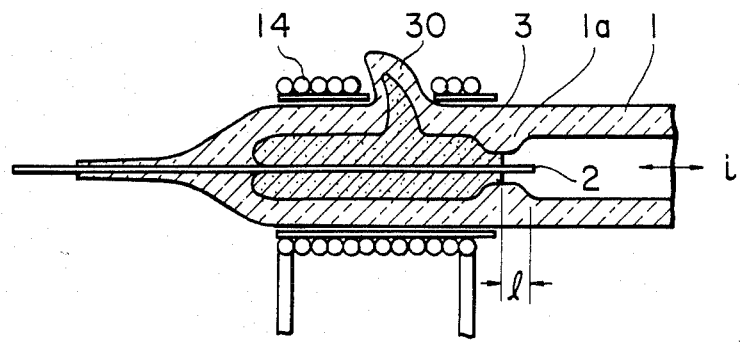
FIG. 11 is a longitudinal sectional view of part of the mercury discharge lamp for showing a lamp current control circuit according to an embodiment of the invention.
Figure 12:
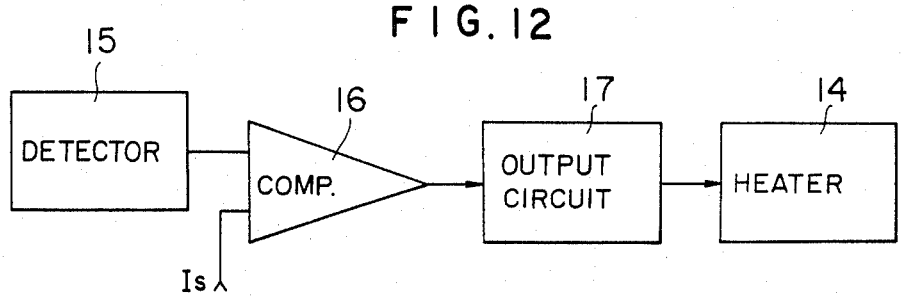
FIG. 12 is a block diagram of the control circuit controlling the lamp current of the mercury discharge lamp shown in FIG. 11.

FIG. 11 is a longitudinal sectional view of part of the mercury discharge lamp for which a lamp current control circuit according to an embodiment of the invention is provided, and FIG. 12 is a block diagram of the lamp current control circuit.

In FIG. 11, the same reference numerals are used to designate the same parts appearing in FIG. 1. Referring to FIG. 11, a heater 14 is wound around the outer peripheral surface of the portion of the glass tube 1 containing the mercury 3. When a current is supplied to cause radiation of heat from the heater 14, the mercury 3 expands by application of heat, and the projection length l of the electrode 2 projecting from the mercury 3 is shortened. The mercury 3 contracts and the electrode projection length l increases when the temperature of heating by the heater 14 is lowered.

Referring to FIG. 12, the lamp current control circuit includes a detector 15 detecting continuously the lamp current supplied to the mercury discharge lamp, a comparator 16 comparing the detected lamp current value i with a reference value or setting $I_s$, and an output circuit 17 supplying necessary current to the heater 14 in response to the output signal of the comparator 16. The output circuit 17 supplies the current to the heater 14 to attain the relation $i = I_s$. Therefore, when the tip portion of the electrode 2 is consumed until the relation $i < I_s$ holds, the current supplied from the output circuit 17 to the heater 14 decreases to lower the temperature of heating by the heater 14 thereby to cause contraction of the mercury 3. The electrode projection length l is restored to that existed before the consumption of the electrode 2, and the lamp current is controlled to hold the relation $i = I_s$. Thus, the lamp current is always maintained constant regardless of consumption of the tip portion of the electrode 2 in use.

Devitrification may occur in the inner wall portion of the glass tube 1 in the vicinity of the tip portion of each electrode 2, and after use of the mercury discharge lamp over a long time, this devitrification may penetrate deep into the inner wall portion until finally the glass tube 1 may be ruptured at this portion. However, by causing progressive contraction of the mercury 3 thereby causing relative displacement of the tip portion of the electrode 2 in practical use, the undesirable deep penetration of devitrification would not occur so that the useful service life of the mercury discharge lamp can be extended.

Figure 13:
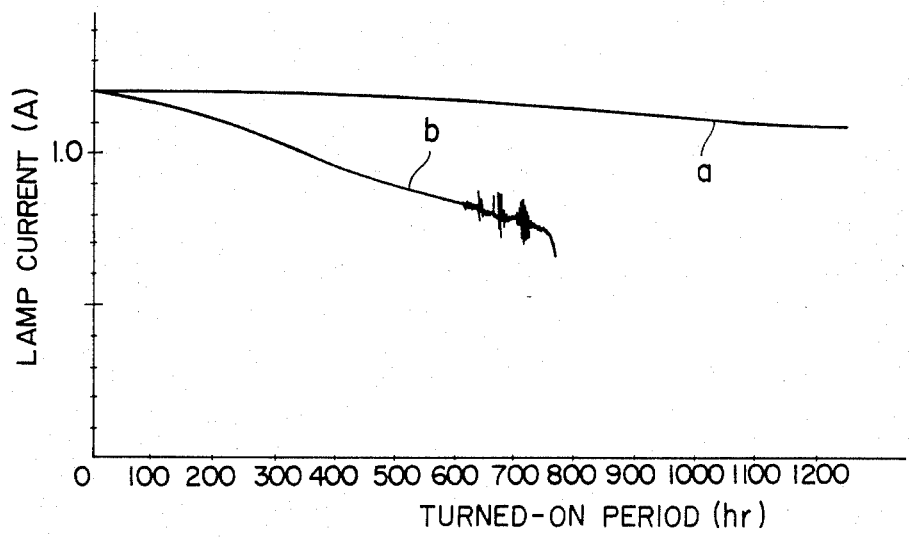
FIG. 13 is a graph showing the relation between the total turned-on period of the mercury discharge lamp and the value of lamp current.

FIG. 13 is a graph showing the relation between the total turned-on period and the value of lamp current in such a mercury discharge lamp. In FIG. 13, the curve a represents the current-time characteristic of the mercury discharge lamp provided with the lamp current control circuit and the curve b represents that of a prior art mercury discharge lamp for which no lamp current control is applied. It will be seen from FIG. 13 that there is not any substantial change in the lamp current value even after a long-time use in the case of the characteristic curve a, whereas the electrode consumption during use leads to a gradual decrease of the lamp current until finally the glass tube is ruptured in the case of the characteristic curve b.

In this lamp current control circuit, the temperature heating the mercury is controlled by a heater wound around the glass tube. However, the same purpose can be attained by controlling the temperature of cooling water flowing outside of the glass tube.

The lamp current control circuit shown in FIG. 12 is provided primarily for the purpose of controlling the lamp current so that the lamp current value tending to change due to progressive consumption of the electrodes can be maintained at the predetermined setting. Besides that purpose, this current control circuit can also be used for adjusting the lamp current value at the predetermined setting when the lamp current value is found to deviate from the predetermined setting due to some factors occurred in the course of manufacture.

It will be understood from the foregoing detailed description that the extra-high pressure mercury discharge lamp according to the present invention can emit light of sharp profile. In spite of the fact that the mercury discharge lamp of the present invention is generally of conventional structure, the dimensional accuracy of an exposed pattern can be improved, and undesirable fluctuation or degradation of the dimensional accuracy can therefore be minimized. The high resolution permits exposure of a very fine pattern by the light source provided by the mercury discharge lamp of the present invention.

We claim:

1. An extra-high pressure mercury discharge lamp comprising an end-sealed glass tube shaped to provide a long arc type tube, mercury contained in the both ends respectively of said glass tube, a pair of electrodes provided in the both ends respectively of said glass tube, said pair of electrodes being spaced from one another by a spacing no greater than 55 mm, each of said electrodes including one end portion extending toward the exterior from the associated end of said glass tube, an intermediate portion immersed in said mercury and the other end portion extending toward the interior beyond the surface of said mercury by about 1 to 3 mm and facing toward the middle of said glass tube, and a power source connected between said externally extending end portions of said electrode pair to supply power thereacross in the range of 1000 V to 2000 V, wherein said internally extending end portions of said electrode pair have a length for permitting said mercury discharge lamp to produce an emission profile such that the percentage of the emission energy concentrated in the region of D/2 (D: the inner diameter of the glass tube) is at least 68% of the total emission energy when the lamp current is in the range of 1.0 A to 1.6 A.

2. An extra-high pressure mercury discharge lamp comprising an end-sealed glass tube shaped to provide a long arc type tube, mercury contained in the both ends respectively of said glass tube, a pair of electrodes provided in the both ends respectively of said glass tube, each of said electrodes including one end portion extending toward the exterior from the associated end of said glass tube, an intermediate portion immersed in said mercury and the other end portion extending toward the interior beyond the surface of said mercury facing toward the middle of said glass tube, and a power source connected between said externally extending portions of said electrode pair to supply power thereacross, wherein said internally extending portions of said electrode pair have a length for permitting said mercury discharge lamp to produce a lamp current lying within the range of 1.0 A to 1.6 A.

3. An extra-high pressure mercury discharge lamp as claimed in claim 1 or 2, further comprising a detector detecting the lamp current, a comparator comparing the detected lamp current value with a predetermined reference value, and control means controlling the volume of the mercury by adjusting the quantity of heat applied to said mercury in response to the output of said comparator.

4. An extra-high pressure mercury discharge lamp comprising an end-sealed glass tube shaped to provide a long arc type tube, mercury contained in the both ends respectively of said glass tube, a pair of electrodes provided in the respective ends of said glass tube, said pair of electrodes being spaced from one another by a spacing no greater than 55 mm, each of said electrodes including one end portion extending toward the exterior from the associated end of said glass tube, an intermediate portion immersed in said mercury and the other end portion extending toward the interior beyond the surface of said mercury by about 1 to 3 mm and facing toward the middle of said glass tube, and power source means connected between said externally extending portions of said electrode pair for supplying power thereacross in the range of 1000 V to 2000 V, said internally extending end portions of said electrode pair having a length for permitting said mercury discharge lamp to produce a lamp current lying within the range of 1.0 A to 1.6 A.

5. An extra-high pressure mercury discharge lamp as claimed in claim 4, further comprising detector means for detecting the lamp current, comparator means for comparing the detected lamp current value with a predetermined reference value, and control means for controlling the volume of the mercury within said glass tube by adjusting the quantity of heat applied to said mercury in response to the output of said comparator means.

* * * * *